United States Patent

Allman et al.

[11] Patent Number: 6,071,817
[45] Date of Patent: Jun. 6, 2000

[54] ISOLATION METHOD UTILIZING A HIGH PRESSURE OXIDATION

[75] Inventors: Derryl D. J. Allman; Kenneth P. Fuchs, both of Colorado Springs, Colo.

[73] Assignee: LSI Logic Corporation, Milpitas, Calif.

[21] Appl. No.: 09/046,242

[22] Filed: Mar. 23, 1998

[51] Int. Cl.⁷ .................................................. H01L 21/00
[52] U.S. Cl. ............................................ 438/692; 438/431
[58] Field of Search ........................... 438/690, 691, 438/692, 431, 265

[56] References Cited

U.S. PATENT DOCUMENTS

| | | | |
|---|---|---|---|
| 5,114,875 | 5/1992 | Baker et al. | 437/62 |
| 5,175,123 | 12/1992 | Vasquez et al. | 437/70 |
| 5,275,974 | 1/1994 | Ellul et al. | 437/203 |
| 5,401,692 | 3/1995 | Lane et al. | 437/239 |
| 5,455,194 | 10/1995 | Vasquez et al. | 437/67 |
| 5,466,628 | 11/1995 | Lee et al. | 437/60 |
| 5,665,620 | 9/1997 | Nguyen et al. | 438/593 |
| 5,786,263 | 7/1998 | Perera | 438/431 |

*Primary Examiner*—Benjamin Utech
*Assistant Examiner*—Kin-Chan Chen

[57] ABSTRACT

The present invention applies a silicon nitride or the like as a mask over portions of a substrate, such as an active region, where oxide growth is undesired. Thereafter, without the formation of a recess in the substrate, a high pressure oxidation process is used to grow an oxide, preferably in a furnace. The oxide thus grows into the non-masked areas of the substrate, as well as over the silicon nitride used as a mask. Thereafter, a chemical-mechanical polish is used to etch away undesired oxide, with the silicon nitride being used as an endpoint to terminate the polish operation.

38 Claims, 2 Drawing Sheets

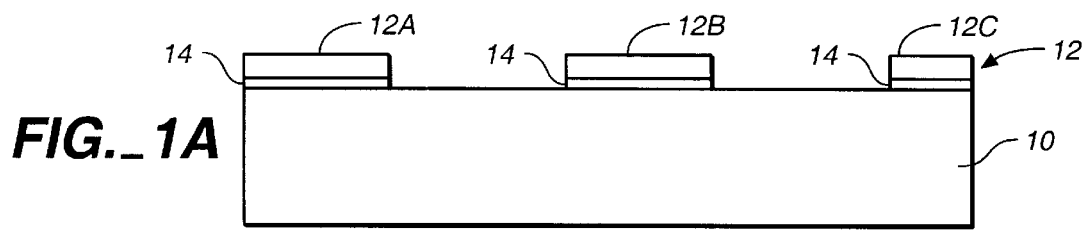
FIG._1A
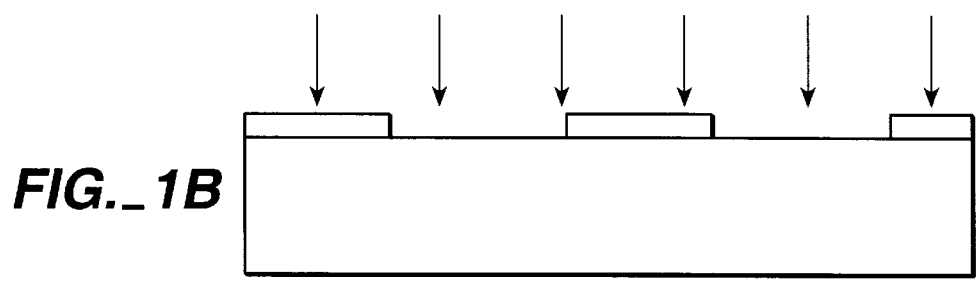
FIG._1B
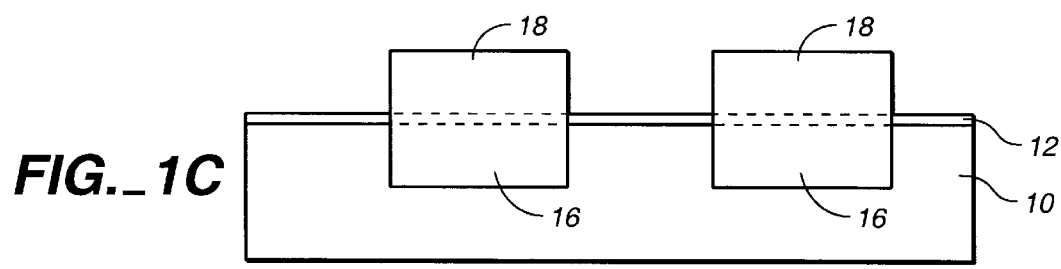
FIG._1C
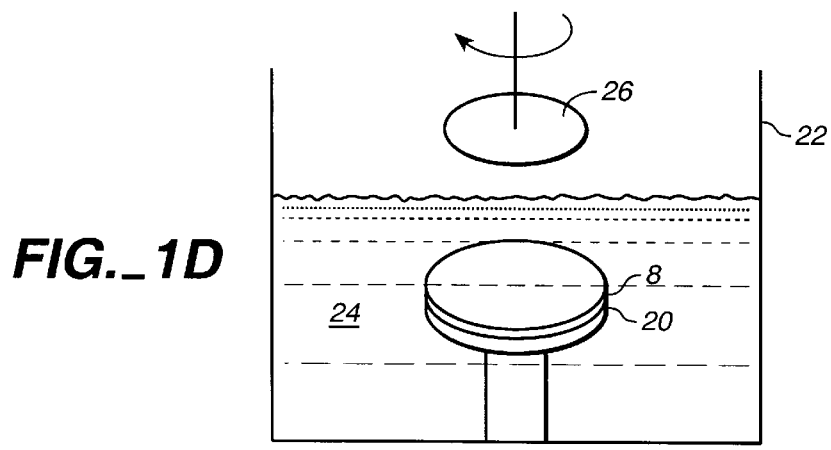
FIG._1D

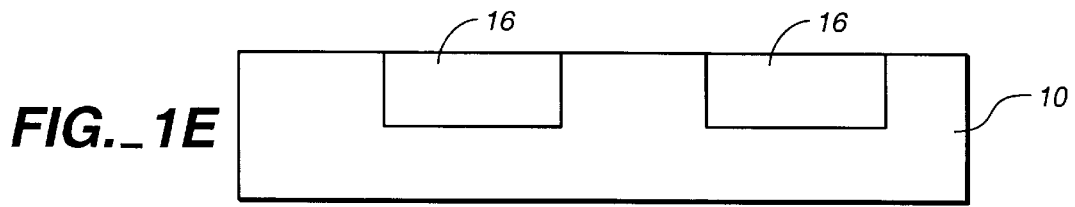
FIG._1E
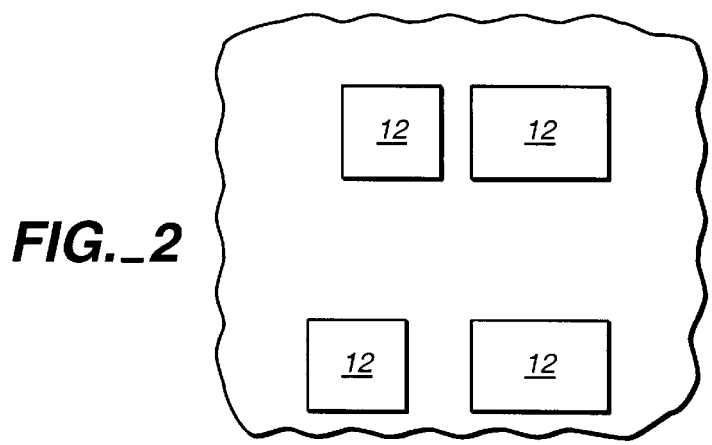
FIG._2
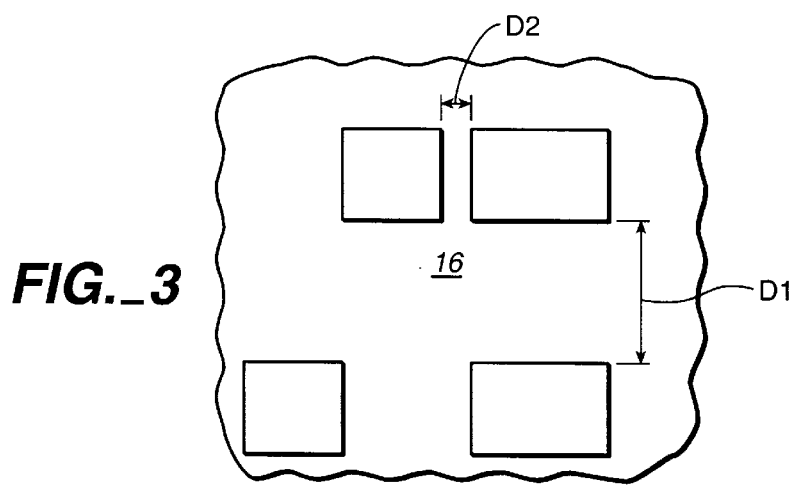
FIG._3
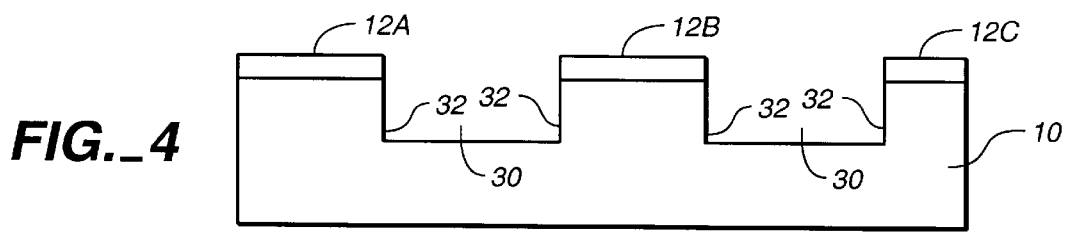
FIG._4

ISOLATION METHOD UTILIZING A HIGH PRESSURE OXIDATION

BACKGROUND

1. Field of the Invention

The present invention relates to an isolation process using high pressure field oxidation.

2. Background of the Related Art

Integrated circuits depend upon electrical isolation between various components on a chip in order to operate properly.

The isolation technique used depends, in part, upon the type of integrated circuit that is being fabricated, and, more specifically, the minimum achievable dimensions of the circuit components being manufactured.

Isolation techniques, generally, form a thick oxide between different circuit components to isolate these components. Different isolation techniques have different advantages, but it is desirable to keep the isolation technique process as simple as possible, while also fabricating an integrated circuit that has repeatable, high quality isolation between components. Simple processes may not provide sufficient isolation, whereas overly complex processes that provide excellent isolation may not be repeatably performed in a cost effective manner.

Current sub 0.35 micron isolation processes typically utilize recessed field oxidation techniques to form an isolation region between active regions on an integrated circuit chip. Generally, a shallow trench isolation (STI) technique is used.

The typical LOCOS masking operation using layers of silicon dioxide, silicon nitride and photoresist are used to define the active regions. After the photomasking operations a plasma etch is used to remove the nitride and oxide in the open areas to expose the silicon at areas where the shallow trench is desired. A plasma silicon etch is used to form the shallow trench in the open areas that has 80–85 degree sidewalls, which shallow trench then serve as the starting point to achieve the desired isolation between transistors. After the etch, the photoresist is removed and a thin oxide is grown in the exposed trench. At this point in the process, ions can be implanted to form the wells and to introduce dopants on the sidewalls of the trench to prevent inversion regions on the sidewalls of the trench. The trenches are then filled, typically with a deposited oxide, which is then polished back to the silicon nitride layer covering the active regions.

This shallow trench isolation technique, though widely used, has disadvantages that the present inventors have identified, including:

1) A sharp active edge at the oxide filled trench region leading to gate oxide reliability problems;

2) Long CMP polishing times leading to non-uniformity, dishing and erosion problems;

3) A step with greater than 85 degree or re-entrant from the isolation oxide to the active region, causing gate oxide polysilicon stringers;

4) Multiple processing steps, in addition to the steps used in conventional LOCOS operations;

5) Design issues because of CMP dishing, including the creation of dummy patterns or design rule limitations;

6) CMP is a dirty process, particles and impurities in slurry, causing post CMP clean operations to be complicated;

7) Trench depth control is difficult because an endpoint cannot be established; and 8) The angle of the trench has to be less than 90 degrees, typically around 85 degrees, in order to prevent high stress regions in the active region, which angle undesirably enhances transistor leakage.

In addition to the above identified disadvantages, the above described operation used to create a STI structure is, undesirably, very expensive due to the large number of processing steps involved and the expensive equipment needed to implement them. Accordingly, a need exists for a new isolation method that is particularly suited for even smaller dimension integrated circuit devices, such as 0.35 um, which method overcomes the disadvantages of current isolation techniques.

SUMMARY OF THE INVENTION

It is an object of the present invention to provide a new isolation technique that provides repeatable isolation for integrated circuit devices, and is particularly applicable to integrated circuit devices having very small dimensions.

It is a further object of the present invention to provide an isolation technique which alleviates stress at the oxide-silicon interface of the isolation region, thereby permitting isolation regions of any size to be formed.

It is still another object of the present invention to provide a method of forming an isolation region that is formed using a grown oxide.

In order to achieve the above objects, among others, the present invention applies a silicon nitride or the like as a mask over portions of a substrate, such as an active region, where oxide growth is undesired. Thereafter, without the formation of a recess in the substrate, a high pressure oxidation process is used to grow an oxide in a furnace. The oxide thus grows into the non-masked areas of the substrate, as well as over the silicon nitride used as a mask. Thereafter, a chemical-mechanical polish is used to remove undesired oxide, with the silicon nitride being used as an endpoint to terminate the polish operation.

By using the above described process, an extremely clean oxide can be repeatably grown into a substrate in a manner that does not create stress, nor damage the substrate.

BRIEF DESCRIPTION OF THE DRAWINGS

These and other advantages of the present invention may be appreciated from studying the following detailed description of the preferred embodiment together with the drawings in which:

FIGS. 1A, 1B, 1C, 1D and 1E illustrate using cross sectional views a process of forming an isolation region in a semiconductor substrate according to the present invention;

FIG. 2 illustrates a top view of a protective layer mask pattern formed over a semiconductor substrate according to the present invention;

FIG. 3 illustrates a top view of an isolation region formed in a semiconductor substrate according to the present invention; and FIG. 4 illustrates a second embodiment of the present invention in which a trench is utilized to increase the thickness of oxide grown in the substrate.

DETAILED DESCRIPTION OF THE PRESENTLY PREFERRED EMBODIMENTS

FIG. 1A illustrates in cross section a part of a protective layer 12, having portions 12A, 12B and 12C, that is used as a mask and is disposed over a substrate 10, which will typically be silicon. The substrate 10 referred to is a portion of a wafer 8 such as illustrated in FIG. 1D, the wafer 8 ultimately containing many integrated circuit chips. Protective layer 12 is preferably silicon nitride, but could also be, for example, polysilicon or oxynitride, and have any thickness range between 20 A to 5000 A. Protective layer 12 needs to be a material that has hardness characteristics that can withstand chemical-mechanical polishing as described hereinafter. Preferably, the protective layer 12 will also inhibit oxide growth over it. Portions 12A, 12B and 12C of protective layer 12 can be obtained using well known masking techniques. A different part of a pattern than shown in FIG. 1A that exists on a wafer 8 is illustrated from a top view in FIG. 3. Protective layer 12 will, therefore, exist over the entire wafer 8.

A buffer layer 14 which can be, for example, a doped or undoped oxide layer whose thickness range is between 20 A to 1000 A, or an organically based material such as spin-on glass, can be grown or deposited over the substrate 10 to separate the substrate from protective layer 12. The protective layer 12 is made of a material that will likely cause damage to the substrate 10 if it directly contacts the substrate 10. Of the protective layer materials previously mentioned, only oxynitride does not require such a buffer layer between it and the substrate 10. Such a thickness range allows for changes in the field oxide encroachment and thickness of the field oxide for the CMP oxide stop, described hereinafter.

After the protective layer is defined the exposed silicon layer can, but need not be, slightly etched, as illustrated in FIG. 4, to create a trench 30 that allows the majority of the thermal oxide to be recessed below the silicon interface. The trench can be up to 5000 A, with a preferred depth of 1200 A. The side walls of the trench can be protected by a deposited nitride layer 32 to prevent lateral oxide growth. The protective nitride layer is deposited then etched away on the top and bottom of structures using a reactive ion etch, which is directional, leaving a silicon nitride "spacer" or "fillet" on the trench sidewall. The nitride layer can be from 50 A to 500 A thick with a preferred thickness of 150 A. If no nitride spacer is used then lateral encroachment is greater. If such a trench 30 is used, the created oxide will have a greater percentage that is recessed below the substrate surface, instead of above the substrate, due to the presence of the trench.

Thereafter, a hydrogen cleaning process is performed. Following the hydrogen cleaning, the process of growing oxide regions over the masked substrate structure follows, as illustrated in FIG. 1B, with oxide regions containing isolation regions 16 that exist between the protective layers 12 and an undesired field oxide 18 extending above the isolation regions and also at locations between the protective layers 12, as illustrated in FIG. 1C. As FIG. 3 illustrates, the oxide 18 will not grow over the protective layer 12. During the growth process, the semiconductor substrate is placed in a furnace and the oxide is grown under high pressure conditions, in which the pressure is between 1 to 20 atmospheres and preferably greater than 2 atmospheres.

This growth takes place at a temperature of between 700 C. to 1100 C., preferably 900 C. and lasts for a duration between 2 to 600 minutes, preferably in the range of 20 to 60 minutes, and, more particularly, 30 minutes. The choice of temperatures and times are dependent on the desired film thickness along with the physical and electrical results.

Using the above described oxide growth process, oxide regions result having a thickness of up to 20,000 A with a preferred thickness of 8000 A. Since approximately 50% of the oxide thickness, corresponding to undesired oxide 18, will be above the top surface of the substrate, the total oxide thickness will be twice that of the thickness of the oxide below the substrate surface.

Other conditions that must be controlled during the oxide growth step are the gas flows (O2; H2, N2) and ratios. In a preferred embodiment, no hydrogen is used during oxide growth. If hydrogen is used, the ratio of O2 to H2 is greater than 1.6 to 1, and preferably 2 to 1, and nitrogen would not typically be introduced. If only O2 and N2 were used, the N2 assists in maintaining uniformity across the surface of the wafer, or wafers if batch processing is used. In that case, only small amounts of N2 are used, typically a less than 5 percent.

After the oxidation process, a global planarization step takes place to remove the undesired oxide 18 that has grown above the substrate 10. As illustrated in FIG. 1D, the entire wafer 8, which contains the substrate 10, the protective layer patterning 12 and the oxide regions is placed on a table 20, cooled to 0 F. to 50 F. with the preferred settings at 50 F. degrees, which assembly is placed within a container 22 and a slurry 24 is introduced. Chemical mechanical polishing, using a pad 26, removes the undesired oxide 18 so that isolation regions 16 result therefrom, which isolation regions are level with the nitride in protective layer 12.

The nitride protective layer has such a slower polish rate that it acts as an oxide stop or support film for the pad 26, until the field oxide is polished down to the same level as the nitride. The protective lawyer and colder polishing table help prevent dishing, and allow for shorter polishing times than conventionally. In comparison to standard STI processes, less oxide is being removed because there is no oxide over the active region. While the isolation oxide regions have to be polished back to the same level as the protective layer 12 over the active region, since less material is being removed, the process is performed more quickly.

The polishing parameters and the polishing consumable items determine the final process characteristics. It has been found that the following polishing settings and consumables can be used for this process although other conditions or consumables could be used to achieve these same or better results. The polishing parameters and consumables are:

a down force of 5 psi;

a backpressure of 1.5 psi;

a pad temperature of 50 F;

a polishing table speed of 28 rpms and a carrier speed of 30 rpms; and consumables being ILD1300 slurry from Rodel, a IC1400 polishing pad and a DF200 carrier film.

After the undesired oxide has been removed the protective layer 12 is then removed using either a wet chemical or dry plasma chemical etch.

FIG. 1E illustrates the resulting structure. There is no need for an annealing step at this point because the oxide does not need to be densified. Further, the damage in the silicon is reduced because the substrate has either not been plasma etched or the damage layer has been consumed in the subsequent oxide growth operation.

FIG. 3 illustrates a top view of isolation regions 16 that are formed, for a portion of a wafer 14 which corresponds to the protective layer 12 illustrated in FIG. 2. It should be noted that isolation regions 16 can have length/width dimensions that are as small as 0.1 um with the partial trench operation or as low as 0.4 um with only the high pressure field oxide growth operation, shown in FIG. 3 as distance D2, and, more significantly, as large as desired without adverse effects from stress.

Advantages of using the high pressure oxide growth according to the present invention include:

1) A denser oxide can be achieved when only oxygen (no hydrogen and oxygen mixture) is used during oxide growth.

2) Lower stress is achieved because the oxide is grown at a lower temperature than conventional processes.

3) The method provides for the usage of hydrogen to preclean the surface prior to oxide growth.

4) The overall process, including the oxide growth step, is much shorter than conventional processes.

5) After the protective layer 12 is removed the resultant transition from the isolation oxide to the active region is less abrupt (reducing the effect of poly gate stringers).

6) Shorter polishing times and subsequently better final film uniformity are achieved, since less film is being removed than in conventional STI processes.

7) Damage to the silicon is reduced since the silicon is not plasma etched. When a shallow trench 30 such as illustrated in FIG. 4 is created, the damage is consumed in the isolation oxidation process.

8) Fewer processing steps are required than STI and subsequently the process is more economical.

9) The lateral oxide growth rate can be reduced by either varying the pressure or using the nitride sidewall layer 32 when a shallow trench 30 such as illustrated in FIG. 4 is used.

While the invention has been described in connection with what is presently considered to be the most practical and preferred embodiments, it is understood that the invention is not limited to the disclosed embodiment. For example, each of the features described above can be used singly or in combination, as set forth below in the claims, without other features described above which are patentably significant by themselves.

Accordingly, the present invention is intended to cover various modifications and equivalent arrangements included within the spirit and scope of the appended claims.

We claim:

1. A method of forming an oxidation layer in a substrate comprising the steps of:
    applying a protective layer as a mask to portions of a top surface of said substrate where oxidation is to be prevented to obtain a masked surface having unmasked portions, said protective layer being capable of withstanding a chemical mechanical polishing;
    oxidizing said masked surface so that oxide regions are created within said substrate at locations corresponding to said unmasked portions; and
    removing a top portion of said oxide regions using a chemical-mechanical polishing operation and a pad to obtain isolation regions, wherein pad support is provided by said protective layer.

2. A method according to claim 1 wherein said protective layer is comprised of silicon nitride, said substrate is silicon, and a buffer layer is disposed between said protective layer and said substrate.

3. A method according to claim 1 wherein said step of oxidizing uses a high pressure oxidation process in which said oxidation pressure is greater than 2 atmospheres.

4. A method according to claim 3 wherein said oxidizing step grows said oxide regions using a temperature that is less than 1100 degrees F.

5. A method according to claim 4 wherein said oxidizing step takes 2 to 600 minutes to complete.

6. A method according to claim 4 wherein said oxidizing step takes 20 to 60 minutes to complete.

7. A method according to claim 1, wherein said substrate is a wafer, and said protective layer is substantially uniformally disposed over various locations on said wafer.

8. A method according to claim 7 wherein said step of applying said protective layer results in unmasked portions having length and width dimensions that are larger than a thickness of said isolation regions.

9. A method according to claim 1 wherein said oxidizing step uses oxygen, without any hydrogen.

10. A method according to claim 1 wherein said oxidizing step grows said oxide regions using a temperature that is less than 1100 degrees F.

11. A method according to claim 1 further including the step of cleaning said masked surface with hydrogen prior to said step of oxidizing.

12. A method according to claim 1 wherein said protective layer is comprised of polysilicon and a buffer layer is disposed between said protective layer and said substrate.

13. A method according to claim 1 wherein said protective layer is oxynitride.

14. A method according to claim 1 wherein said substrate is not subjected to a plasma etch.

15. A method according to claim 1 further comprising the step of forming a trench in said substrate at locations corresponding to said unmasked portions prior to said step of oxidizing.

16. A method according to claim 15 wherein sidewalls of said trench are protected using nitride protective layer.

17. A method according to claim 1 wherein said oxide regions grows over said unmasked portions, but no substantial oxide growth occurs over said masked surface.

18. A method according to claim 1 wherein a top surface of said isolation regions substantially corresponds to a top surface of said protective layer.

19. A method of forming an oxidation layer in a substrate comprising the steps of:
    applying a protective layer as a mask to portions of a top surface of said substrate where oxidation is to be prevented to obtain a masked surface having unmasked portions, said protective layer being capable of withstanding a chemical mechanical polishing and inhibiting oxide growth over a top surface of said protective layer;
    oxidizing said masked surface so that oxide regions are created within said substrate at locations corresponding to said unmasked portions; and
    removing a top portion of said oxide regions using a chemical-mechanical polishing operation and a pad to obtain isolation regions, wherein pad support is provided by said protective layer.

20. A method according to claim 19 wherein said step of oxidizing uses a high pressure oxidation process in which said oxidation pressure is greater than 2 atmospheres.

21. A method according to claim 20 wherein said oxidizing step grows said oxide regions using a temperature that is less than 1100 degrees F.

22. A method according to claim 19 wherein said oxidizing step uses oxygen, without any hydrogen.

23. A method according to claim 19 wherein said oxidizing step grows said oxide regions using a temperature that is less than 1100 degrees F.

24. A method according to claim 19 further including the step of cleaning said masked surface with hydrogen prior to said step of oxidizing.

25. A method according to claim 19 wherein said oxidizing step takes 2 to 600 minutes to complete.

26. A method according to claim 19 wherein said oxidizing step takes 20 to 60 minutes to complete.

27. A method according to claim 19 wherein said substrate is not subjected to a plasma etch.

28. A method according to claim 19 wherein a top surface of said isolation regions substantially corresponds to a top surface of said protective layer.

29. A method according to claim 19 further comprising the step of forming a trench in said substrate at locations corresponding to said unmasked portions prior to said step of oxidizing.

30. A method according to claim 29 wherein sidewalls of said trench are protected using a nitride protective layer.

31. A method according to claim 29 wherein said step of oxidizing uses a high pressure oxidation process in which said oxidation pressure is greater than 2 atmospheres.

32. A method according to claim 31 wherein said oxidizing step grows said oxide regions using a temperature that is less than 1100 degrees F.

33. A method according to claim 29 wherein said oxidizing step uses oxygen, without any hydrogen.

34. A method according to claim 29 wherein said oxidizing step grows said oxide regions using a temperature that is less than 1100 degrees F.

35. A method according to claim 29 further including the step of cleaning said masked surface with hydrogen prior to said step of oxidizing.

36. A method according to claim 19 wherein said protective layer is comprised of silicon nitride, said substrate is silicon, and a buffer layer is disposed between said protective layer and said substrate.

37. A method according to claim 19 wherein said protective layer is comprised of polysilicon and a buffer layer is disposed between said protective layer and said substrate.

38. A method according to claim 19 wherein said protective layer is oxynitride.

* * * * *